(12) United States Patent
Schaefer

(10) Patent No.: US 6,327,209 B1
(45) Date of Patent: Dec. 4, 2001

(54) MULTI STAGE REFRESH CONTROL OF A MEMORY DEVICE

(75) Inventor: Scott Schaefer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/650,721

(22) Filed: Aug. 30, 2000

(51) Int. Cl.[7] .................................................. G11C 7/00
(52) U.S. Cl. ............................ 365/222; 365/203; 365/236
(58) Field of Search .................................... 365/222, 203, 365/233, 236

(56) References Cited

U.S. PATENT DOCUMENTS

| 5,511,033 | 4/1996 | Jung . |
| 5,566,119 | 10/1996 | Matano . |
| 5,627,791 | 5/1997 | Wright et al. . |
| 5,715,206 | 2/1998 | Lee et al. . |
| 5,901,101 | * 5/1999 | Suzuki et al. ........................ 365/222 |
| 6,137,743 | * 10/2000 | Kim ..................................... 365/222 |
| 6,144,617 | * 11/2000 | Takai .................................... 365/233 |

* cited by examiner

Primary Examiner—Son T. Dinh
(74) Attorney, Agent, or Firm—Dickstein Shapiro Morin & Oshinsky LLP

(57) ABSTRACT

A memory device is disclosed which includes a refresh control circuit which responds to a refresh request command and performs at least two refresh operations. In the first refresh operation, a first word line is selected and memory cells associated with the first word line are refreshed and thereafter a second word line is selected and memory cells associated with the second word line are refreshed, wherein the first and second refresh requests are separated by a predetermined period of time.

27 Claims, 4 Drawing Sheets

MULTI STAGE REFRESH CONTROL OF A MEMORY DEVICE

BACKGROUND OF THE INVENTION

1. Field of the Invention

The present invention relates generally to the field of dynamic random access memory (DRAM) devices and more particularly, to a synchronous DRAM (SDRAM) with a multi stage refresh control.

2. Description of the Related Art

SDRAMs have been developed as a way of increasing speed of DRAM memory devices. SDRAMs offer a significant increase in speed over conventional DRAMs, operating at speeds above 66 MHz, 100 MHz or faster. DRAMS and SDRAMs are "dynamic" in the sense that the stored data, typically in the form of charged and discharged capacitors contained in memory cells arranged in a large array, will dissipate the charge after a relatively short period of time because of a charge's natural tendency to distribute itself into a lower energy state. Thus, to maintain data integrity, it is necessary to refresh each of the memory rows within a refresh period of time. A refresh operation generally comprises copying the data held in the memory cells into one or more registers or latches and then copying the data in the registers or latches back into the memory cells. In other words, the charged or discharged state of the capacitor must be reapplied to each individual memory cell in a repetitive manner. The maximum amount of time allowable between refreshing operations is determined by the charge storage capabilities of the capacitors used in the memory cell array.

An SDRAM operates in synchronism with a clock signal supplied thereto from a microprocessor, a microcomputer or a memory controller (collectively called a "memory controller"). The memory controller also supplies the SDRAM with a data-read command or a data-write command. In response thereto, the memory device operates to read or write data from or into a selected memory cell or cells in synchronism with the clock signal. These memory cell arrays are typically arranged in rows and columns such that a particular memory cell may be addressed by specifying its row and column within the array. A wordline supplies a gate voltage to access transistors which turn on to connect the capacitors in a row of cells to a set of bit lines and associated sense amplifiers which detect the data stored in the capacitors. In a read operation, an addressed subset of the stored data is sensed by the sense amplifiers and output. A refresh operation is similar to a read operation, but no data is output. In a refresh operation, the sensing of the data in the cells by the sense amplifiers simultaneously results in the data being rewritten back to the cells. The data is thus "refreshed."

In recent years, the memory capacity, i.e. the number and density of memory cells, of memory devices has been increasing. Accordingly, the size of each cell, including storage capacitor size, has been shrinking which also shortens the cell's data holding time. Typically, a memory device receives the refresh request command in the conventional standardized cycle which is about every 15.625 $\mu$sec. However, with increasing cell number and density, it is becoming more and more difficult to refresh all memory cells at least once within the refresh time period. Hence, what is needed is a memory device with an optimized, controlled refresh operation.

SUMMARY OF THE INVENTION

It is therefore an object of the present invention to provide a memory device, for example, a DRAM or SDRAM wherein all the memory cells are refreshed in response to a refresh command such that a first refresh operation is performed in which a first wordline is first selected and the memory cells associated with the first wordline are refreshed and a second refresh operation is performed in which a second wordline, different from the first, is subsequently selected and the memory cells associated with the second wordline are refreshed. Refresh operations are performed back to back, with the initiation of first and second refresh operations being separated by a period of time such that the current draw from the first refresh operation is about completed prior to the start of the second refresh operation. Hence, at least two wordlines are separately selected and the memory cells associated with each of the at least two wordlines are refreshed each time a refresh command is issued.

BRIEF DESCRIPTION OF THE DRAWINGS

These and other features and advantages of the invention will be more clearly understood from the following detailed description of the invention which is provided in connection with the accompanying drawings.

DETAILED DESCRIPTION OF PREFERRED EMBODIMENTS

In the following description, for purposes of explanation, specific numbers, materials and configurations are set forth in order to provide a thorough understanding of the present invention. However, it will be apparent to one skilled in the art that the present invention need not be practiced exactly as described, and that many modifications, substitutions and other changes can be made without departing from the scope of the invention. Moreover, in the following description well known features are omitted or simplified in order not to obscure the present invention. Furthermore, for ease of understanding, certain operations are described in a particular order, however, these operations are not to be construed as necessarily order dependent in their actual performance. Moreover, although the invention will be discussed in the context of an SDRAM memory device, it should be understood that the invention is applicable to any memory device which requires a refresh operation.

Figure 1:
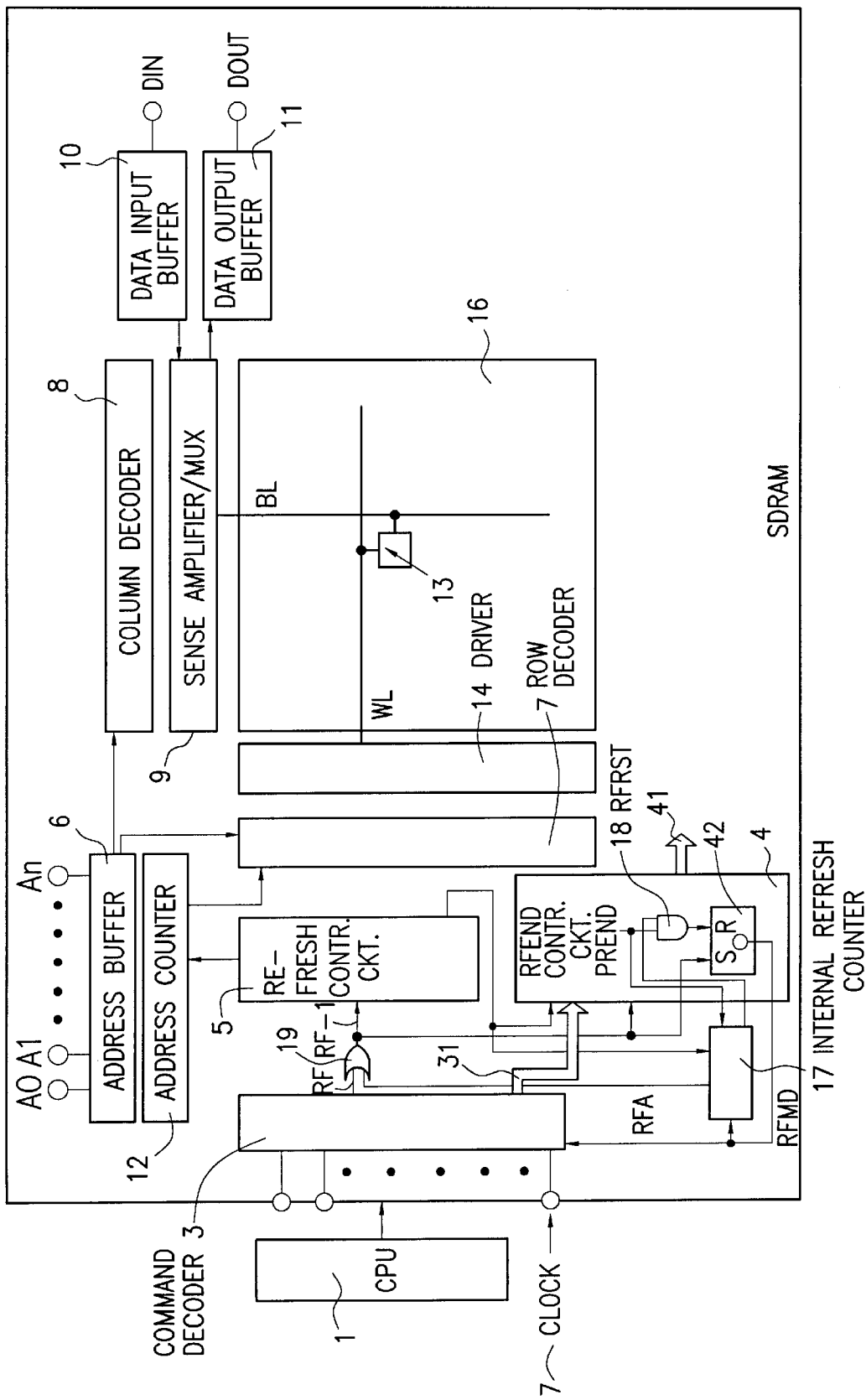
FIG. 1 is a circuit diagram showing a memory device, e.g. an SDRAM, according to an exemplary embodiment of the present invention.

Referring now to the drawings, where like reference numerals designate like elements, FIG. 1 shows a SDRAM 2 coupled to a CPU 1 with an integrated memory controller and to a clock signal CLOCK 7. The CPU 1 supplies a data-write or a data-read command to the SDRAM 2 as well as a refresh command in synchronism with the clock signal CLOCK 7. The command supplied is decoded by a command decoder 3 which then produces and supplies decoded information 31 to an internal control circuit 4. The SDRAM 2 is thus brought into a desired operation by a set of internal control signals 41 from the circuit 4. The CPU 1 further supplies address signals A0 to An to an address buffer 6 to designate a memory cell which is to be subject of the desired operation. A row decoder 7 receives row address information and a column decoder 8 receives column address information from the address buffer 6. As a result, word line WL and bit line BL in a memory cell array 16 are selected to designate one of memory cells 13. Note, only one word line, bit line and memory cell 13 are shown. Also, during a refresh operation, a sense-amplifier/multiplexer circuit 9 is further activated, so that data stored in a row of memory cells connected to the selected word line are read and then restored.

When the command from the CPU 1 is a read command, the selected memory cell is coupled through the multiplexer circuit 9 to a data output buffer 11. The data stored in the selected memory cell 13 is thus read out as an output data Dout. In the case of the data-write command from CPU 1, an input data Din is written into the selected memory cell by a data input buffer 10.

SDRAM 2 further contains an internal refresh counter 17 to control the number of times refresh operations are performed in response to each refresh request command which is supplied by CPU 1. In this exemplary embodiment, the number of refresh operations performed in response to each refresh command is set to two. That is, the refresh operation is performed twice in response to each received refresh request command. Although the invention is described with respect to two refresh operations, it should be understood that any number of refresh operations are possible based upon a single refresh command. In addition, the number of refresh operations occurring in response to a single refresh command can be a fixed or programmable number.

Figure 2:
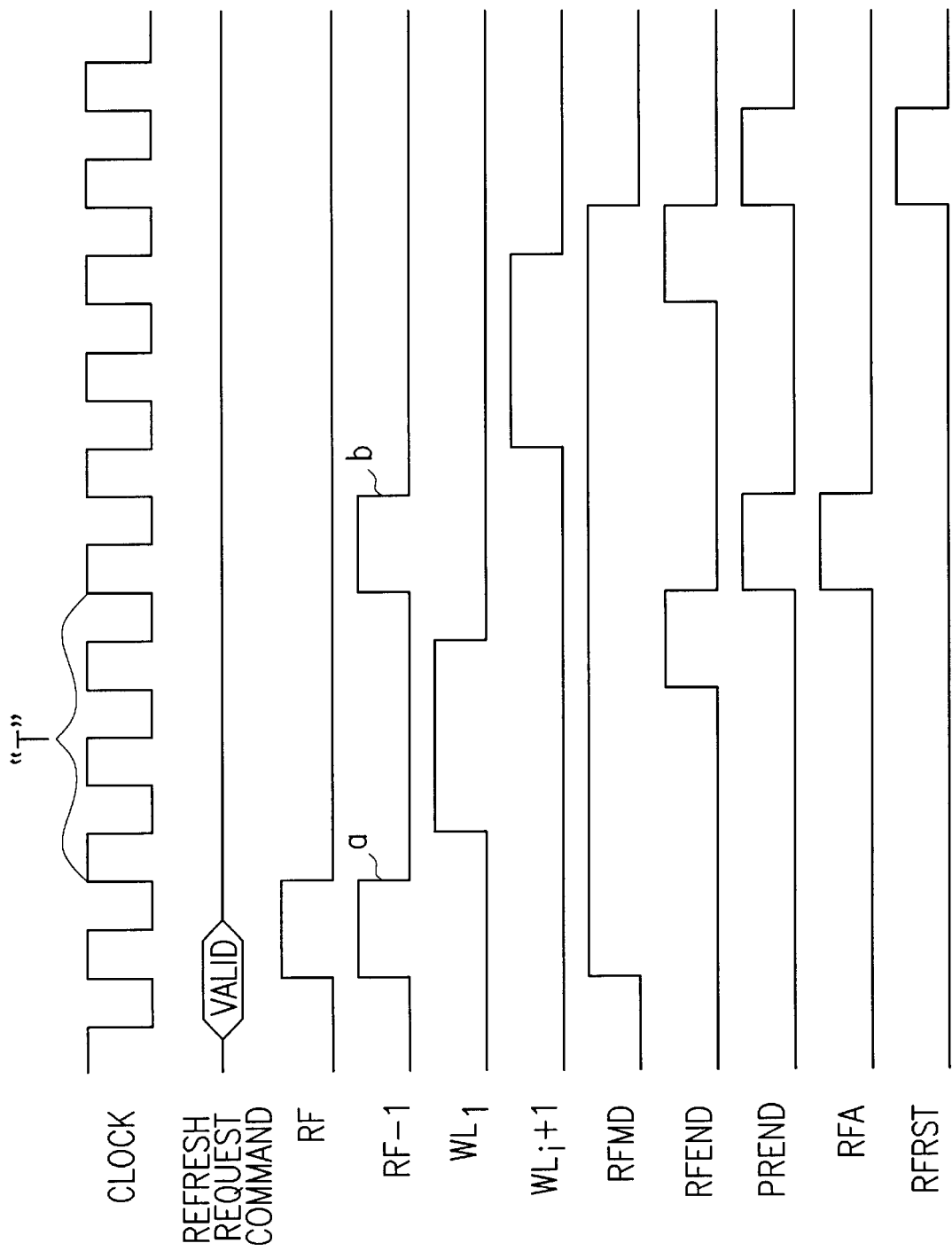
FIG. 2 is a timing chart explaining a refresh operation of the memory device shown in FIG. 1.
Figure 3:
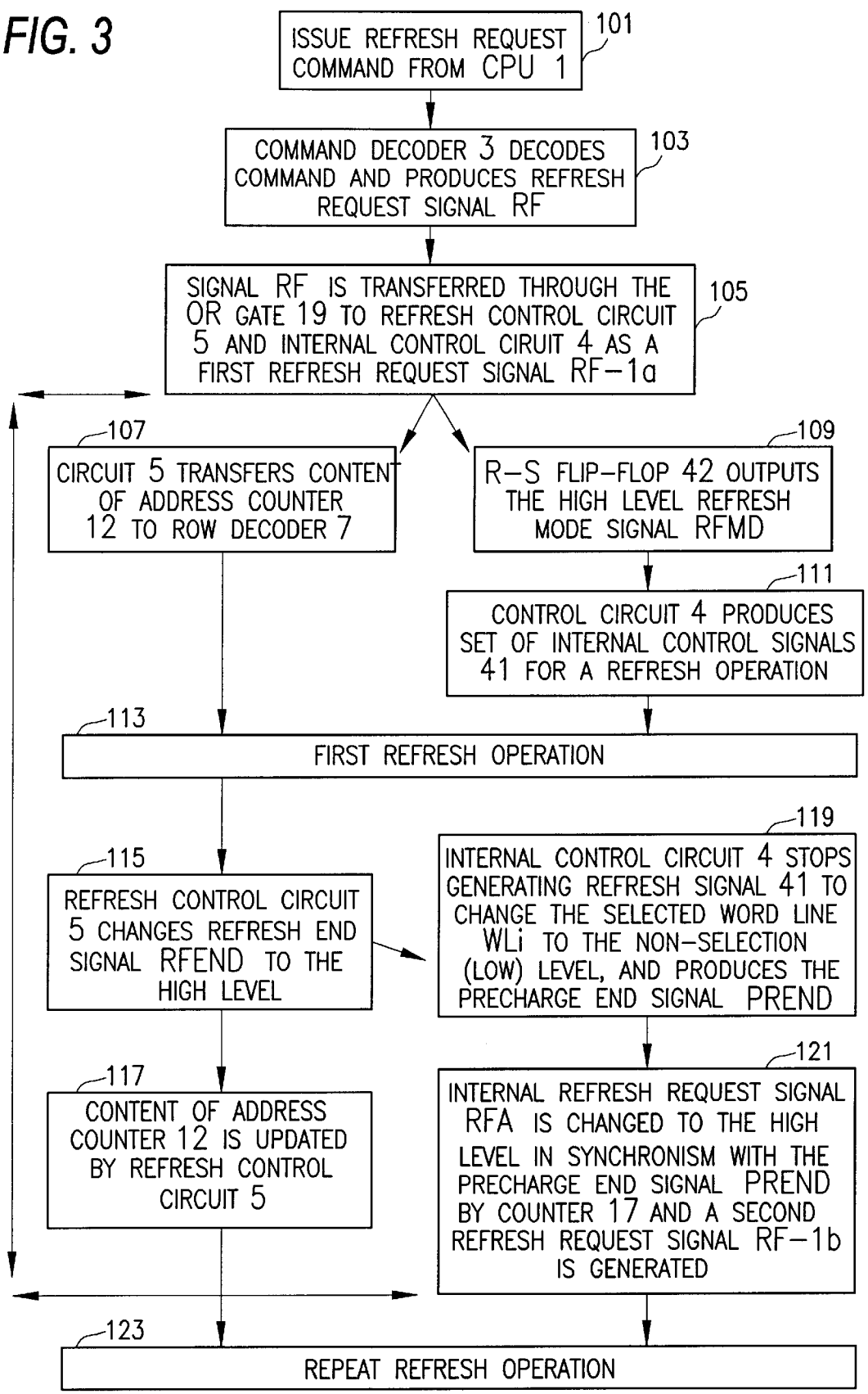
FIG. 3 is a flowchart explaining a refresh operation of the memory device shown in FIG. 1.

As shown in FIGS. 2 and 3, when the CPU 1 issues a refresh request command at processing segment (101) of FIG. 3 in synchronism with the clock signal, the command decoder 3 decodes this command and produces the refresh request signal RF at processing segment (103). This signal RF is transferred through the OR gate 19 to the refresh control circuit 5 and the internal control circuit 4 as a first refresh request signal RF-1$a$ at processing segment (105). Refresh control circuit 5 operates to transfer the content of the address counter 12 to the row decoder 7 at processing segment (107). Optionally, an R-S flip-flop 42 in the circuit 4 outputs a high level refresh mode signal RFMD as shown in FIG. 2 to prevent the command decoder 3 from responding to a further command from the CPU 1 at processing segment (109). The control circuit 4 further produces the set of internal control signals 41 for a refresh operation at processing segment (111). As a result, a word line WLi is selected by the row decoder 7 in response to the content of the address counter 12 and is driven by a driver 14 to the selection (high) level. Further, the sense amplifier circuit 9 is activated to refresh the memory cells coupled to the selected word line WLi at processing segment (113).

When a period of time or number of clocks required to perform the first refresh operation has elapsed, the refresh control circuit 5 changes a refresh end signal RFEND to the high level, as shown in FIG. 2 at processing segment (115). In response, the content of the address counter 12 is updated by the refresh control circuit 5 which increments the prior row address at processing segment (117). Also, in response to the refresh end signal RFEND, the internal control circuit 4 stops generating the refresh control signal 41 to change the selected word line WLi to the non-selection (low) level, and produces the precharge end signal PREND at processing segment (119). Also, the internal refresh request signal RFA is changed to the high level in synchronism with the precharge end signal PREND. The high level of the signal RFA produces a second refresh request signal RF-1$b$ through the OR gate 19 at processing segment (121).

It is critical that the refresh requests are performed back to back, with the first request RF-1$a$ and second request RF-1$b$ being separated by a period of time T, as shown in FIGS. 2 and 3, such that the current drawn from the first refresh operation can be about completed prior to the start of the second refresh operation. In other words, the current draw associated with the second refresh operation occurs after the current draw for the first refresh operation peaks. This may be about two times greater than the time required to activate and precharge a word line (sometimes referred to as "$t_{RFC}$" or "$t_{RC}$"). Preferably, this time period is about 1.5 to about 1.7 times greater than the time to activate and precharge a wordline, and more preferably, about 1.6 times greater than the time to activate and precharge a wordline. Further, the low level refresh reset signal RFRST causes the AND gate 18 to maintain its output at the low level irrespective of the production of the signal PREND. The refresh mode signal RFMD is thereby held at the high level, as shown in FIG. 2.

In response to the second refresh request signal RF-1$b$, the refresh control circuit 5 and the internal control circuit 4 initiates the refresh operation again at processing segment (123). More specifically, the refresh control circuit 5 operates to transfer the updated content of the internal refresh address counter 12, by incrementing the prior row address, to the row decoder 7 and the control circuit 4 produces the set of internal control signals 41 for a refresh operation. As a result, a second word line is selected by the row decoder 7 and driven by the driver 14 to the selection (high) level, as shown in FIG. 2. Therefore, until the refresh operation count reaches two, the counter 17 produces an internal refresh request signal RFA each time one refresh operation is completed, which signal RFA is in turn supplied through an OR gate 19 to the control circuits 5 and 4. Further, until the refresh operation reaches two, the internal refresh counter 17 maintains a refresh reset signal RFRST at a low level which is supplied through an AND gate 18 to prevent the flip-flop 42 from being reset. That is, the refresh mode signal RFMD is held at high level until the refresh operation is performed twice. Note, the refresh reset signal RFRST can be set at a low level and the refresh mode signal RFMD held at a high level for any number of desired refresh operations per refresh command received from the memory controller CPU 1.

When the period of time required to perform the second refresh operation has elapsed, the refresh control circuit 5 changes the signal RFEND to the high level, as shown in FIG. 2. In response to the signal RFEND, the internal control circuit 4 stops generating the refresh control signals 41. As a result, a second word line is changed to the non-selection (low) level, as shown in FIG. 2. But, the internal refresh counter 17 changes a refresh reset signal RFRST to the high level based upon the transition of the refresh end signal RFEND from the high level to the low level, because it counts two pulses of the refresh end signal RFEND signal, as shown in FIG. 2. At this time, the signal RFA is not produced. Accordingly, the flip-flop 42 is reset by the precharge end signal PREND to change the refresh mode signal RFMD to the low level. The command decoder 3 is thereby allowed to respond to a next command from the CPU 1.

The invention thus provides a memory device which is responsive to a refresh command refreshing all the memory cells by a first refresh operation in which a first word line is selected and the memory cells associated with the selected word line are refreshed and a second refresh operation in which a different word line and different memory cells associated with the different selected word line are refreshed. The refresh operations are performed back to back, with the first request and second request being separated by a period of time such that peak current draw from the first refresh operation has been substantially completed prior to the start of the second refresh operation. Hence, at least two word lines are selected in sequence and the memory cells associated with each of the two word lines are refreshed each time a refresh command is issued by the memory controller CPU 1.

Although the invention has been described with reference to refreshing different word lines in succession upon receipt of a refresh command, it is also possible to refresh different portions of same or different word lines in succession upon receipt of a refresh command.

Figure 4:
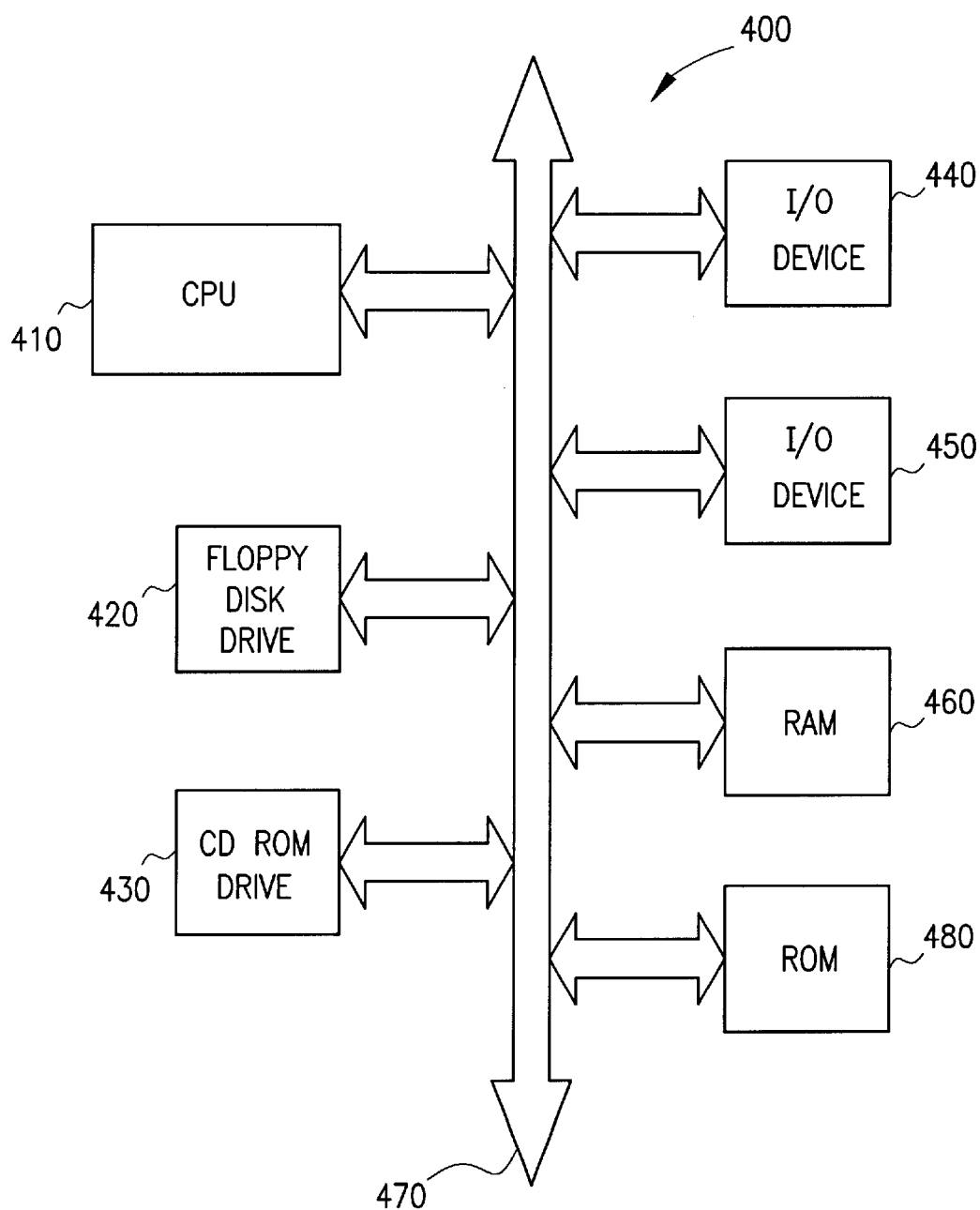
FIG. 4 is a processor based system utilizing a memory device constructed pursuant to the present invention.

A typical processor based system which includes a memory device, e.g. SDRAM 460 fabricated as previously described with reference to FIGS. 1–3 is illustrated generally at 400 in FIG. 4. A computer system is exemplary of a system having integrated circuits, such as for example memory circuits. Most conventional computers include memory devices permitting storage of significant amounts of data. The data is accessed during operation of the computers. Other types of dedicated processing systems, e.g., radio systems, television systems, GPS receiver systems, telephones and telephone systems also contain memory devices which can utilize the present invention.

A processor based system, such as a computer system 400, for example, generally comprises a central processing unit (CPU) 410, for example, a microprocessor, that communicates with one or more input/output (I/O) devices 440, 450 over a bus 470. The computer system 400 also includes the random access memory (RAM) 460, read only memory (ROM) 480 and may include peripheral devices such as a floppy disk drive 420 and a compact disk (CD) ROM drive 430 which also communicate with CPU 410 over the bus 470. RAM 460 has a refresh control circuit as previously described with reference to FIGS. 1–3. It may also be desirable to integrate the processor 410 and memory 460 on a single IC chip.

While certain embodiments of the invention have been described and illustrated above, the invention is not limited to these specific embodiments as numerous modifications, changes and substitutions of equivalent elements can be made without departing from the spirit and scope of the invention. Accordingly, the scope of the present invention is not to be considered as limited by the specifics of the particular structures which have been described and illustrated, but is only limited by the scope of the appended claims.

What is claimed as new and desired to be protected by Letters Patent of the United States is:

1. A memory device comprising:
   a refresh command decoder for receiving and decoding a refresh command; and
   a refresh circuit for performing at least a first refresh operation and a second refresh operation in response to each received refresh command, said refresh circuit first refreshing the memory cells of a first selected at least portion of a word line in said first refresh operation and then after a predetermined period of time refreshing the memory cells of a second selected at least portion of a word line in a second refresh operation;
   wherein said predetermined period of time is sufficient to separate the first refresh operation and the second refresh operation so that the second refresh operation is started after a current draw associated with said first refresh operation has peaked.

2. The device of claim 1 wherein said period of time is about two times greater than the time required to activate and precharge a word line.

3. The device of claim 1 wherein said period of time is about 1.5 to about 1.7 times greater than the time required to activate and precharge a wordline.

4. The device of claim 1 wherein said period of time is about 1.6 times greater than the time required to activate and precharge a wordline.

5. The device of claim 1 further comprising an address buffer for storing an address contained within address signals for designating said word lines for said refresh operation.

6. The device of claim 1 further comprising an internal refresh counter for maintaining a refresh reset signal at a low level until said first and second refresh operation are completed.

7. The device of claim 1 further comprising a row-decoder for activating said wordline.

8. The device of claim 1 wherein more than two refresh operations are performed in response to each decoded refresh command.

9. The device of claim 1 wherein said device is a synchronous random access memory.

10. The device of claim 1 wherein said refresh command is issued by a central processing unit or a memory controller.

11. A processor base d system comprising:
   a central processing unit;
   a memory device coupled to said central processing unit to receive data from and supply data to said central processing unit, said memory device comprising:
      a refresh command decoder for receiving and decoding a refresh command; and
      a refresh circuit for performing at least a first refresh operation and a second refresh operation in response to each received refresh command, said refresh circuit first refreshing the memory cells of a first selected word line in said first refresh operation and then after a predetermined period of time refreshing the memory cells of a second selected word line in a second refresh operation;
      wherein said predetermined period of time is sufficient to separate the first refresh operation and the second refresh operation so that the second refresh operation is started after a current draw associated with said first refresh operation has peaked.

12. The system of claim 11 wherein said period of time is about two times greater than the time required to activate and precharge a word line.

13. The system of claim 11 wherein said period of time is about 1.5 to about 1.7 times greater than the time required to activate and precharge a wordline.

14. The system of claim 11 wherein said period of time is about 1.6 times greater than the time required to activate and precharge a wordline.

15. The system of claim 11 further comprising an address buffer for storing an address contained within address signals for designating said word lines for said refresh operation.

16. The system of claim 11 further comprising an internal refresh counter for maintaining a refresh reset signal at a predetermined logic level until said first and second refresh operation are completed.

17. The system of claim 11 further comprising a row-decoder for activating said wordline.

18. The system of claim 11 wherein more than two refresh operations are performed in response to each decoded refresh command.

19. The system of claim 11 wherein said device is a synchronous random access memory.

20. The system of claim 11 wherein said refresh command is issued by a central processing unit or a memory controller.

21. A method of operating a memory device, comprising:
generating a refresh control signal upon receipt of a refresh command signal;
performing at least a first and second refresh operation in response to said refresh control signal, said refresh control signal causing the memory cells of a first selected word line to be refreshed in said refresh operation and the memory cells of a second selected word line to be refreshed in said second refresh operation; and
said first and second refresh operations being performed sequentially and being separated by a predetermined period of time, wherein said predetermined period of time is sufficient to separate the first refresh operation and the second refresh operation so that the second refresh operation is started after a current draw associated with said first refresh operation has peaked.

22. The method of claim 21 wherein said period of time is about two times greater than the time required to activate and precharge a word line.

23. The method of claim 21 wherein said period of time is about 1.5 to about 1.7 times greater than the time required to activate and precharge a word line.

24. The method of claim 21 wherein said period of time is about 1.6 times greater than the time required to activate and precharge a word line.

25. The method of claim 21 wherein more than two refresh operations are performed in response to each refresh command.

26. A memory device as in claim 1 wherein said refresh circuit first refreshes the memory cells of a first selected word line in said first refresh operation and then after said predetermined period of time refreshes the memory cells of a second selected wordline.

27. A memory device comprising:
a refresh command decoder for receiving and decoding a refresh command; and
a refresh circuit for performing at least a first refresh operation and a second refresh operation in response to each received refresh command, said refresh circuit first refreshing the memory cells of a first selected portion of a word line in said first refresh operation and then after a predetermined period of time refreshing the memory cells of a second selected portion of a word line in a second refresh operation.

* * * * *